US010867994B2

(12) United States Patent
Shi et al.

(10) Patent No.: US 10,867,994 B2
(45) Date of Patent: Dec. 15, 2020

(54) HIGH DENSITY CAPACITORS FORMED FROM THIN VERTICAL SEMICONDUCTOR STRUCTURES SUCH AS FINFETS

(71) Applicant: Cirrus Logic International Semiconductor Ltd., Edinburgh (GB)

(72) Inventors: Zhonghai Shi, Austin, TX (US); Marc L. Tarabbia, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/910,843

(22) Filed: Mar. 2, 2018

(65) Prior Publication Data
US 2018/0190648 A1  Jul. 5, 2018

Related U.S. Application Data

(62) Division of application No. 15/144,657, filed on May 2, 2016, now Pat. No. 9,929,147.

(60) Provisional application No. 62/158,892, filed on May 8, 2015.

(51) Int. Cl.
| H01L 27/06 | (2006.01) |
| H01L 21/8234 | (2006.01) |
| H01L 29/66 | (2006.01) |
| H01L 29/78 | (2006.01) |
| H01L 49/02 | (2006.01) |
| H01L 27/08 | (2006.01) |

(52) U.S. Cl.
CPC .. *H01L 27/0629* (2013.01); *H01L 21/823431* (2013.01); *H01L 27/0805* (2013.01); *H01L 28/86* (2013.01); *H01L 28/90* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| 6,762,087 | B1 | 7/2004 | Chittipeddi |
| 2004/0198003 | A1 | 10/2004 | Yeo et al. |
| 2005/0266652 | A1 | 12/2005 | Chudzik et al. |
| 2007/0158717 | A1* | 7/2007 | Edelstein .......... H01L 21/76814 257/296 |
| 2008/0197399 | A1 | 8/2008 | Hsu et al. |
| 2009/0097186 | A1* | 4/2009 | Topaloglu ................ H01G 4/30 361/306.3 |

(Continued)

FOREIGN PATENT DOCUMENTS

| JP | 2001/257316 A | 9/2001 |
| JP | 2002/043433 A | 2/2002 |

(Continued)

*Primary Examiner* — Khaja Ahmad
(74) *Attorney, Agent, or Firm* — Norton Rose Fulbright US LLP

(57) ABSTRACT

A vertical structure may be used as a high density capacitance for an integrated circuit. These thin vertical structures can be configured to operate as an insulator in a metal-insulator-metal (MIM) capacitor. The vertical structures may be manufactured using three-dimensional semiconductor manufacturing technology, such as FinFET (fin field effect transistor) technology and manufacturing processes. The capacitors based on thin vertical structures may be integrated with other circuitry that can utilize the thin vertical structures, such as FinFET transistors.

15 Claims, 10 Drawing Sheets

(56) References Cited

U.S. PATENT DOCUMENTS

| | | | |
|---|---|---|---|
| 2009/0108318 A1* | 4/2009 | Yoon | H01L 27/10817 257/306 |
| 2011/0020987 A1 | 1/2011 | Hareland et al. | |
| 2011/0298025 A1 | 12/2011 | Haensch et al. | |
| 2012/0153370 A1 | 6/2012 | Furuta et al. | |
| 2012/0168902 A1 | 7/2012 | Zhu et al. | |
| 2013/0113072 A1 | 5/2013 | Liu et al. | |
| 2013/0113073 A1 | 5/2013 | Liu et al. | |
| 2013/0270620 A1* | 10/2013 | Hu | H01L 21/76229 257/296 |
| 2013/0309832 A1 | 11/2013 | Cheng et al. | |
| 2014/0042547 A1 | 2/2014 | Khakifirooz et al. | |
| 2014/0061744 A1* | 3/2014 | Zhang | H01L 21/845 257/300 |
| 2014/0065779 A1* | 3/2014 | Zhang | H01L 21/02592 438/283 |
| 2014/0167220 A1 | 6/2014 | Ramsbey et al. | |
| 2014/0191323 A1* | 7/2014 | Bergendahl | H01L 21/823431 257/368 |
| 2014/0239448 A1* | 8/2014 | Anderson | H01L 28/91 257/534 |
| 2014/0268491 A1 | 9/2014 | Katkar et al. | |
| 2015/0014776 A1 | 1/2015 | Akarvardar et al. | |
| 2015/0129538 A1* | 5/2015 | Grange | H01G 13/00 216/6 |
| 2016/0148998 A1 | 5/2016 | Wu et al. | |

FOREIGN PATENT DOCUMENTS

| | | |
|---|---|---|
| JP | 2002/133952 A | 5/2002 |
| JP | 2002/222924 A | 8/2002 |
| JP | 2008/172103 A | 7/2008 |
| JP | 2009/071325 A | 4/2009 |
| JP | 2010/199161 A | 9/2010 |
| JP | 2014/075499 A | 4/2014 |
| WO | 2014/039558 A1 | 3/2014 |
| WO | 2014/093647 A1 | 6/2014 |

* cited by examiner

HIGH DENSITY CAPACITORS FORMED FROM THIN VERTICAL SEMICONDUCTOR STRUCTURES SUCH AS FINFETS

CROSS-REFERENCE TO RELATED PATENT APPLICATIONS

This application is a divisional of U.S. patent application Ser. No. 15/144,657 to Zhonghai Shi et al. filed May 2, 2016, and entitled "High Density Capacitors Formed From Thin Vertical Semiconductor Structures Such As FINFETs," which claims the benefit of priority of U.S. Provisional Patent Application No. 62/158,892 to Zhonghai Shi et al. filed May 8, 2015, and entitled "Methods and Implementations for using FinFET Technology to Make High Density Capacitors," both of which are incorporated by reference herein.

FIELD OF THE DISCLOSURE

The instant disclosure relates to manufacturing integrated circuits. More specifically, portions of this disclosure relate to manufacturing capacitors integrated with integrated circuits.

BACKGROUND

Capacitors are important components of many electronic devices, and in particular mixed-signal circuits that process both analog and digital circuitry. Capacitors can be manufactured separate from and then coupled to integrated circuits (ICs) as external capacitors. Capacitors can also be integrated into the ICs. Compared to external capacitors, integrated capacitors consume less space, have lower profiles, and generally are easier to include in low-profile electronic devices such as mobile phones.

A conventional capacitor structure is a planar metal-insulator-metal (MIM) structure, and one such structure is shown in FIG. 1. FIG. 1 is a cross-sectional view of a metal-insulator-metal (MIM) capacitor according to the prior art. A capacitor 100 includes an insulator layer 104 surrounded by metal layers 102 and 106. A capacitance of a MIM structure is related to the lateral area (L*W) of the MIM capacitor and the thickness (T) of the insulator layer 104. The capacitance provided by conventional planar MIM capacitors, such as that of FIG. 1, limits the density of circuitry on a substrate that includes integrated capacitors.

Shortcomings mentioned here are only representative and are included simply to highlight that a need exists for improved electrical components, particularly for capacitors employed in consumer-level devices, such as mobile phones. Embodiments described herein address certain shortcomings but not necessarily each and every one described here or known in the art.

SUMMARY

One manner of increasing a density of capacitance in an integrated circuit (IC) is to construct vertical structures, rather than planar structures. Substrates are often much thicker than needed for integrated circuits because thin substrates are difficult to handle, and even thick substrates are still very thin in comparison to the electronic devices that house the substrates. For example, thicknesses of substrates are often measured in micrometers, whereas the thicknesses of electronic devices are often measured in millimeters. That is, the electronic devices are often thousands of times thicker than the substrates used to make the ICs. Even though the substrates may be hundreds of micrometers thick, the circuitry constructed on the substrates only occupies a very small portion of the top of the substrate. Thus, capacitors constructed vertically into the substrate can make use of previously unused space in an integrated circuit to provide higher density capacitance than conventionally available.

One embodiment of a vertical structure can include thin vertical semiconductor structures manufactured on the substrate. These thin vertical structures can be configured to operate as an insulator in a capacitor. The capacitance of such a structure is proportional to the height of the structure. The height of the structure can be increased without largely affecting the lateral dimensions of such a structure. Thus, higher densities of capacitors may be manufactured when the capacitors are manufactured from thin vertical structures than the conventional planar transistors. Further, in some embodiments, the thin vertical structure can be manufactured into the substrate. This may allow for manufacturing of high density capacitors without significantly increasing a height of the IC. In one embodiment, the vertical structures may be manufactured using three-dimensional semiconductor manufacturing technology, such as FinFET (fin field effect transistor) technology and manufacturing processes.

In accordance with the prior art, the fins provided by FinFET technology have been used as Metal-Oxide-Semiconductor Field-Effect Transistor (MOSFET) channels. The fin in modern 3D technologies can be manufactured very thin such that it can be used as dielectrics for integrated capacitors. In embodiments of the disclosure, the layout efficiency for fin capacitors can be much greater than one to provide a much more efficient layout because the fin height to fin pitch ratio can be increased to be much greater than one.

The capacitors based on thin vertical structures may be integrated with other circuitry that can utilize the thin vertical structures. For example, a large number of thin vertical structures may be built on a substrate. Some of those thin vertical structures may be formed into capacitors, and others of those thin vertical structures may be formed into transistors or other semiconductor components. The higher height/pitch ratio provided by the thin vertical structure dielectrics in accordance with the present disclosure may provide higher capacitor density than conventional planar capacitors. The thicknesses of the thin vertical structures may vary across a substrate. This may allow, for example, capacitors to be formed from thinner vertical structures than other circuitry on the substrate also being formed from the thin vertical structures.

According to one embodiment, a method of making an integrated circuit using three-dimensional semiconductor manufacturing technology may include forming thin vertical semiconductor structures on a substrate; forming a dielectric on the thin vertical semiconductor structures; and/or forming electrodes around the dielectric to create capacitors.

In certain embodiments, the method of making the integrated circuit may include forming an oxide by oxidizing the thin vertical semiconductor structures to form the dielectrics for the capacitor or by depositing an oxide on the thin vertical semiconductor structures; forming a conducting layer over the oxide on the thin vertical semiconductor structures; using a smoothing process to form the electrodes for the capacitor from the deposited conducting layer; forming silicon oxide, and wherein the step of forming the conducting layer comprises depositing a polysilicon layer; and/or forming the thin vertical semiconductor structures with a height greater than a pitch such that a ratio between the height to pitch is greater than one, thereby providing the capacitor as a high density capacitor.

One method of integrating the thin vertical semiconductor capacitors with other circuitry may include forming a protection layer over a first portion of the substrate before forming active devices, wherein the thin vertical semiconductor structures are formed in a second portion of the substrate not covered by the protection layer; removing the protection layer from the first portion of the substrate after forming the capacitors; forming a second protection layer over the capacitors; forming the active devices in the first portion of the substrate not covered by the second protection film; and/or forming the active devices in the first portion of the substrate; forming the electric components as planar devices in the first portion of the substrate.

Another method of integrating the thin vertical semiconductor capacitors with other circuitry may include forming a protection layer over a first plurality of the thin vertical semiconductor layer, wherein the capacitors are created from a second plurality of the thin vertical semiconductor structures not covered by the protection layer; removing the protection layer from the first plurality of the thin vertical semiconductor structures; forming a second protection layer over the created capacitors; forming FinFET transistors using the first plurality of the thin vertical semiconductor structures not covered by the second protection film; and/or removing the second protection layer before a source/drain implant step of the forming FinFET transistors step.

According to another embodiment, an apparatus may include a three-dimensional integrated circuit including a first plurality of thin vertical semiconductor structures, in a first portion of a substrate, wherein the first plurality is configured to be used as a dielectric for capacitors; electrodes coupled to the first plurality of thin vertical structures and configured to provide electrical contact to the capacitors; and/or a second plurality of thin vertical semiconductor structures, in a second portion of the substrate, wherein the second plurality is configured to be used as transistors.

In certain embodiments, the thin vertical semiconductor structures may include a base with an oxidized surface on the base to be used as the dielectrics for the capacitors; the thin vertical semiconductor structures may include a silicon base with a silicon oxide surface on the silicon base to be used as the dielectrics for the capacitors; a ratio of a height of the thin vertical semiconductor structures to a pitch of the thin vertical semiconductor structures may be greater than one, thereby providing that the capacitors are high density capacitors; the electrodes may extend approximately an entire length and height of the thin vertical semiconductor structures; and/or the thin vertical semiconductor structures may include FinFET structures.

In some embodiments, the apparatus may include a smoothed conducting layer over the thin vertical semiconductor structures forming the electrodes for the capacitors; a smoothed polysilicon layer over the thin vertical semiconductor structures forming the electrodes for the capacitors; and/or electronics manufactured on the substrate, the electronics being coupled to the capacitors and including active devices or active planar devices.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

A method of using thin vertical structures, such as those made with FinFET technology, to make and provide high density capacitors for integrated circuits is described in some embodiments below. In some embodiments, the high density capacitors may be manufactured through semiconductor processing by forming thin silicon structures, oxidizing some of those structures, and forming electrodes around oxidized thin silicon structures. The high density capacitors may be manufactured as part of integrated circuits (ICs) including other thin silicon structures used for other components and/or other structures used for other components.

Figure 1:
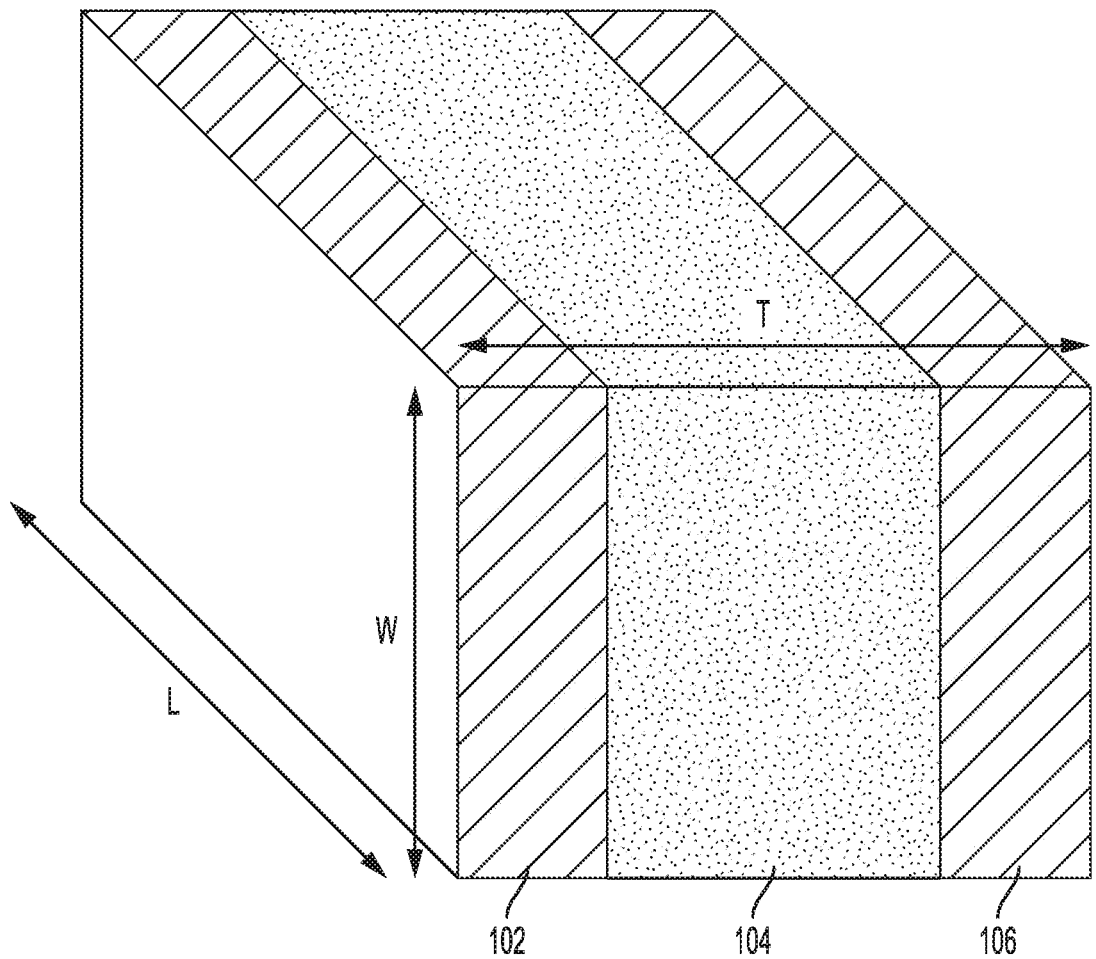
FIG. 1 is a cross-sectional view of a planar metal-insulator-metal (MIM) capacitor according to the prior art.
Figure 2A:
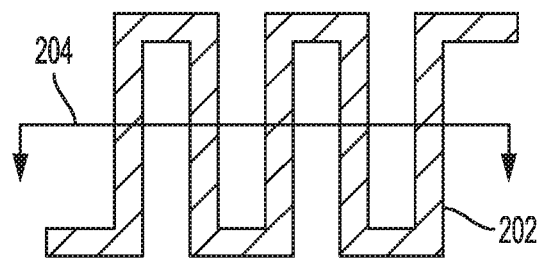
FIG. 2A is a top-down view of thin vertical structures formed on a substrate according to one embodiment of the disclosure.
Figure 2B:
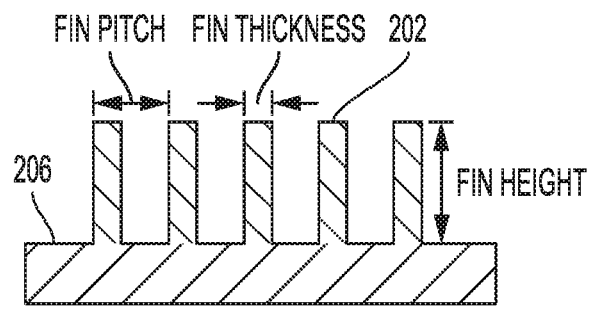
FIG. 2B is a cross-sectional view of thin vertical structures formed on a substrate according to one embodiment.

One manufacturing process for manufacturing high density capacitors is described with reference to FIGS. 2A-B, 3A-B, and 4A-B. FIG. 2A is a top-down view of thin vertical structures formed on a substrate according to one embodiment of the disclosure; and FIG. 2B is a cross-sectional view of thin vertical structures through line 204 formed on a substrate according to one embodiment. Thin silicon structures 202 may be formed on substrate 206. The thin vertical structures 202 may be silicon fins manufactured with FinFET technology processes on silicon substrates. In some embodiments, capacitors built using the thin vertical structures may have oxidized thin vertical structures, and that oxidization is not part of other structures manufactured with FinFET technology. In some embodiments, capacitors built using the thin vertical structures may use a significant amount of the height of the thin vertical structure to improve capacitance, whereas other structures manufactured with FinFET technology only use a fraction of the height of the thin vertical structure. Although a silicon substrate is used as an example in certain embodiments throughout this description, any semiconductor substrate, such as silicon germanium (SiGe), gallium arsenide (GaAs), or others, may be used in the same or similar manufacturing processes. Further, in certain embodiments, insulator-based substrates may also be used. The thin vertical structures 202 may be shaped in a snake pattern as shown in FIG. 2A, but may also be formed in other shapes, such as quadrilaterals, triangles, circles, ovals, polygons, or other arbitrary closed or open shapes.

The dimensions of the thin vertical structures 202 may be characterized by fin pitch, fin height, and/or fin thickness. A fin thickness may be defined as a lateral distance from a start of one structure to an end of a structure through a cross-section of the structure at its thinnest point. In some embodiments, the fin thickness for the structures 202 may be 2-12 nanometers, or in certain embodiments approximately 5-6 nanometers. A fin pitch between the structures may be defined as a distance between the start of one structure and the start of the next structure. In some embodiments, the fin pitch may be approximately 20 to 80 nanometers. A fin height may be defined as a vertical distance from a top of the substrate 206 to a top of the thin vertical structure 202. In some embodiments, the fin height may be approximately 40 to 160 nanometers. For a same amount of fin pitch, if the fin height is larger, then a higher capacitance value may be provided. The fin height may be larger than the fin pitch. Layout efficiency may be proportional to a ratio of fin height to fin pitch. In some embodiments, layout efficiencies of greater than one may be achieved with thin vertical structures 202.

Figure 3A:
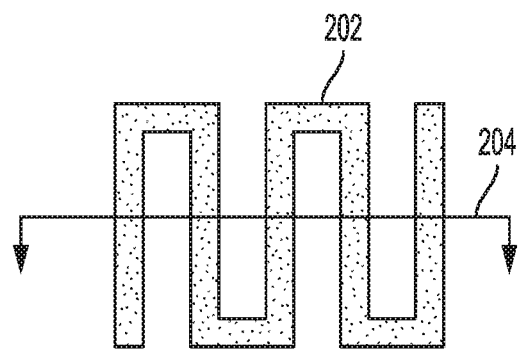
FIG. 3A is a top-down view of thin vertical structures formed on a substrate after oxidation of the structures according to one embodiment of the disclosure.
Figure 3B:
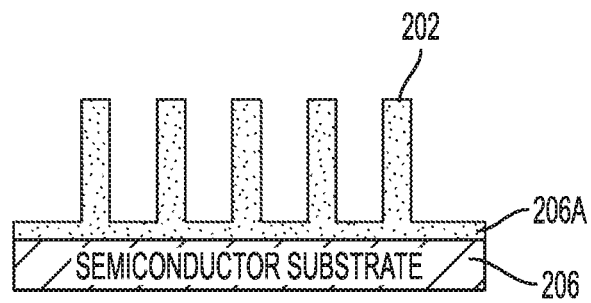
FIG. 3B is a cross-sectional view of thin vertical structures formed on a substrate after oxidation according to one embodiment of the disclosure.

Next, the thin vertical structures may be oxidized to form the insulator of a conductor-insulator-conductor capacitor structure. FIG. 3A is a top-down view of thin vertical structures formed on a substrate after oxidation of the structures according to one embodiment of the disclosure; and FIG. 3B is a cross-sectional view of thin vertical structures formed on a substrate after oxidation according to one embodiment of the disclosure. The thin vertical structures may be oxidized through reactive processes to form silicon dioxide on a surface of the thin vertical structures 202 and/or diffuse oxide through the thin vertical structures 202 to form oxidized thin vertical structures 206A. For example, when the substrate 206 is silicon, the substrate 206 may be placed in an oven and heated to sufficiently high temperatures in an oxygen atmosphere to cause the silicon to react with oxygen to form silicon oxide. Although the oxide 206A is shown throughout the thin vertical structures 206A, the oxide coverage may not be uniform throughout all of the thin vertical structures. Further, the oxide 206A may not extend completely through the thin vertical structures 206. Finally, although the oxide 206A is shown extending into the substrate 206, the substrate 206 may not be oxidized during oxide formation on the thin silicon structures 202. In some embodiments, the oxide 206A may be formed through depositing additional material, rather than oxidization of existing material, such as through chemical vapor deposition (CVD) or atomic layer deposition (ALD).

Figure 4A:
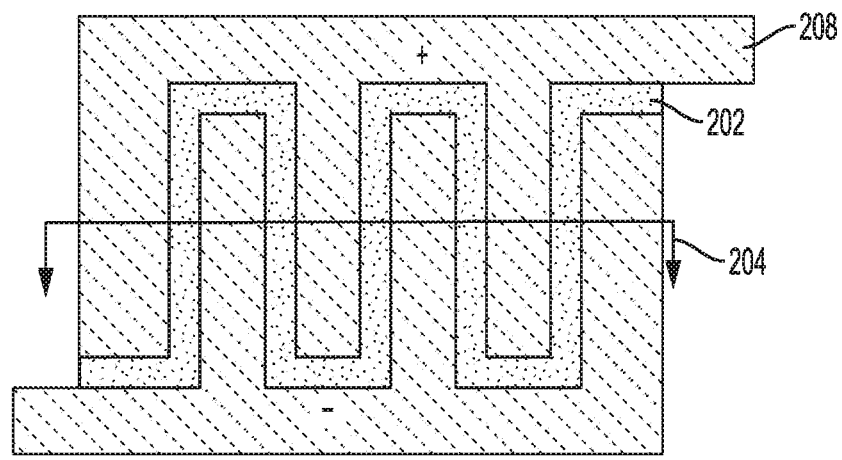
FIG. 4A is a top-down view of a capacitor formed from oxidized thin vertical structures according to one embodiment of the disclosure.
Figure 4B:
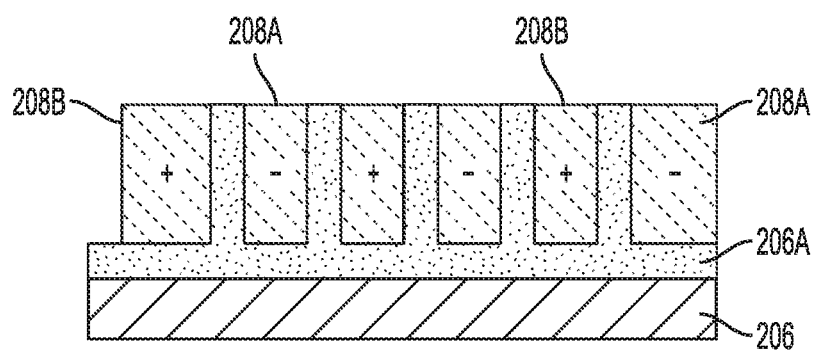
FIG. 4B is a cross-sectional view of a capacitor formed from oxidized thin vertical structures according to one embodiment of the disclosure.

After oxidization, electrodes around the oxidized thin vertical structures may be formed. The electrodes may form the conducting layers of a conductor-insulator-conductor capacitor. In one embodiment, the conductor may be a metal and the capacitor have a metal-insulator-metal (MIM) capacitor structure. However, conductors other than metal may also be used in the capacitors. FIG. 4A is a top-down view of a capacitor formed from oxidized thin vertical structures according to one embodiment of the disclosure; and FIG. 4B is a cross-sectional view of a capacitor formed from oxidized thin vertical structures according to one embodiment of the disclosure. A conducting layer 208 may be deposited on and/or around the oxidized thin vertical structures 202. The conducting layer 208 may include metal films, polysilicon films, and/or gate electrode materials. As examples, the conducting layer 208 may be evaporated onto the structures 202, the conducting layer 208 may be deposited through physical sputter deposition on the structures 202, the conducting layer 208 may be deposited through atomic layer deposition (ALD) on the structures 202, and/or the conducting layer 208 may be deposited through electrodeposition on the structures 202. After deposition of the conducting layer 208, the conducting layer may be leveled to approximately a top of the thin vertical structures 202 to form separate electrodes 208A and 208B. For example, a Chemical Planarization or Polishing (CMP) process, etch methods, or similar methods may be used to form electrodes 208A and 208B for the capacitor. The electrode 208A, the thin vertical structure 202, and the electrode 208B may form a conductor-insulator-conductor capacitor, such as a metal-insulator-metal (MIM) capacitor. Although metal-insulator-metal structures are described, the "metal" layer of the structure may be understood to be any conducting material and thus include, for example, polysilicon. Although two electrodes 208A and 208B are shown in FIGS. 4A-4B, more than two electrodes may be formed after the planarization of conducting material 208 depending on the layout of the thin vertical structures 202 and/or the number of capacitors being formed for an integrated circuit. In some embodiments, multiple capacitors may be formed from a plurality of thin vertical structures, and each capacitor may include two electrodes, such that there is a plurality of electrodes corresponding to a plurality of capacitors formed from the thin vertical structures.

Figure 5:
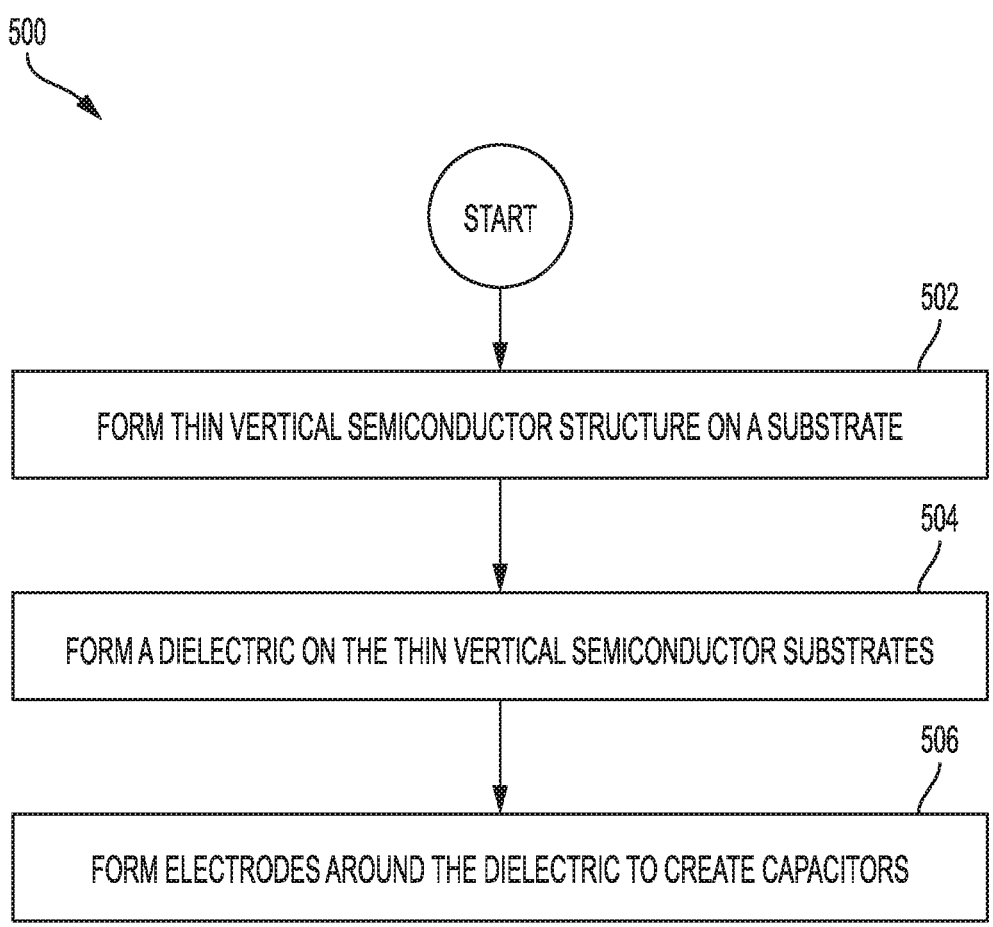
FIG. 5 is an example flow chart illustrating a method for manufacturing a capacitor from thin vertical structures according to one embodiment of the disclosure.

FIG. 5 is an example flow chart illustrating a method for manufacturing a capacitor from thin vertical structures according to one embodiment of the disclosure. A method 500 begins at block 502 with forming thin vertical structures on a substrate, such as by forming the structures from the substrate itself. In some embodiments, the structures may be formed by depositing and patterning materials to form semiconductor structures on a substrate, which may allow the capacitors to be formed on an insulating substrate, such as silicon dioxide ($SiO_2$).

Then, at block 504, a dielectric may be formed on the thin vertical semiconductor substrates. The dielectric may be used as the insulator of the capacitor being formed. In some embodiments, when the substrate is a semiconductor, the oxide may be formed on the substrate simultaneously with the thin vertical structures to provide an insulating layer between a later formed conductor and the semiconductor substrate. In some embodiments, blocks 502 and 504 may be combined by forming thin vertical structures in an insulating substrate such that the resulting thin vertical structures are already oxidized.

Next, at block 506, electrodes are formed around the dielectric of the thin vertical structures to create capacitor structures. In some embodiments, the capacitor may have a higher density than conventional planar capacitors because the thin vertical structure provides additional capacitance along a height of the structure without consuming additional lateral space.

Figure 6A:
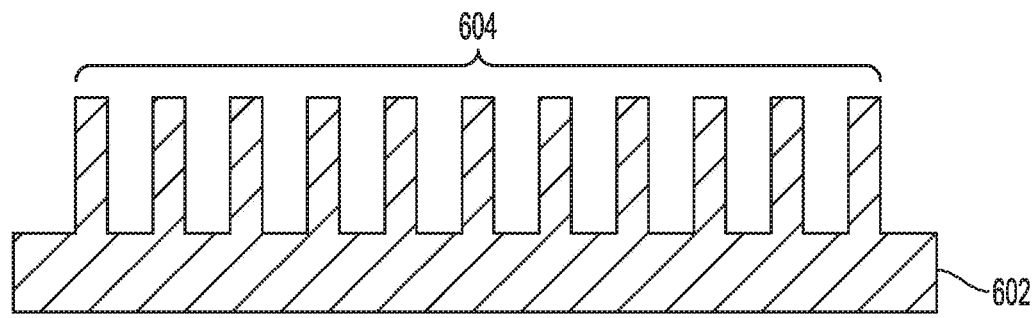
FIG. 6A is a cross-sectional view illustrating formation of thin silicon structures according to one embodiment of the disclosure.
Figure 6B:
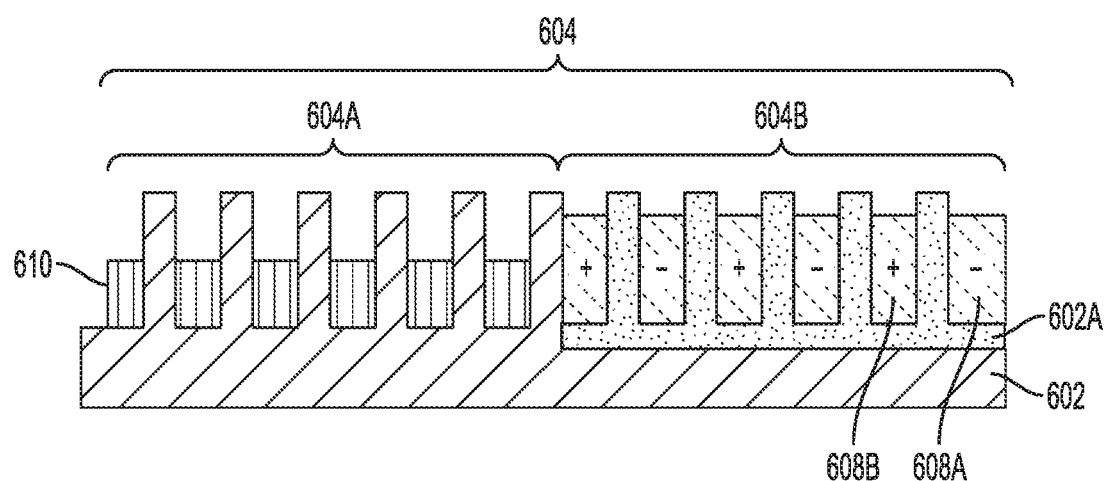
FIG. 6B is a cross-sectional view illustrating a varied use of thin silicon structures as different electronic components according to one embodiment of the disclosure.

The high density capacitors formed on thin vertical structures may be formed as part of integrated circuits containing other components. One embodiment of such an integration is shown in FIGS. 6A-B. FIG. 6A is a cross-sectional view illustrating formation of thin silicon structures according to one embodiment of the disclosure. First, a plurality of thin vertical structures 604 may be formed on substrate 602. Then, a portion of the plurality of thin vertical structures 604 may be used to form capacitors while another portion of the plurality of thin vertical structures 604 may be used to form other components, such as active devices including transistors. FIG. 6B is a cross-sectional view illustrating a varied use of thin silicon structures for different applications according to one embodiment of the disclosure. A first portion 604A of thin vertical structures 604 may be formed into transistors of an electronic component, such as by depositing field isolation oxide 610. Additional layers and electrodes may later be formed in or on the first portion 604A to complete construction of particular arrangements of transistors or other components. A second portion 604B of thin vertical structures 604 may be formed into capacitors coupled to or integrated with the electronic component with electrodes 608A and 608B around oxide 602A. Metal layers deposited over the thin vertical structures 604 may be used to couple the capacitors with the active devices. Although not shown, planar devices may also be constructed alongside the thin vertical structures 604 and coupled to the components formed from the thin vertical structures 604, such as capacitors or transistors.

Figure 7:
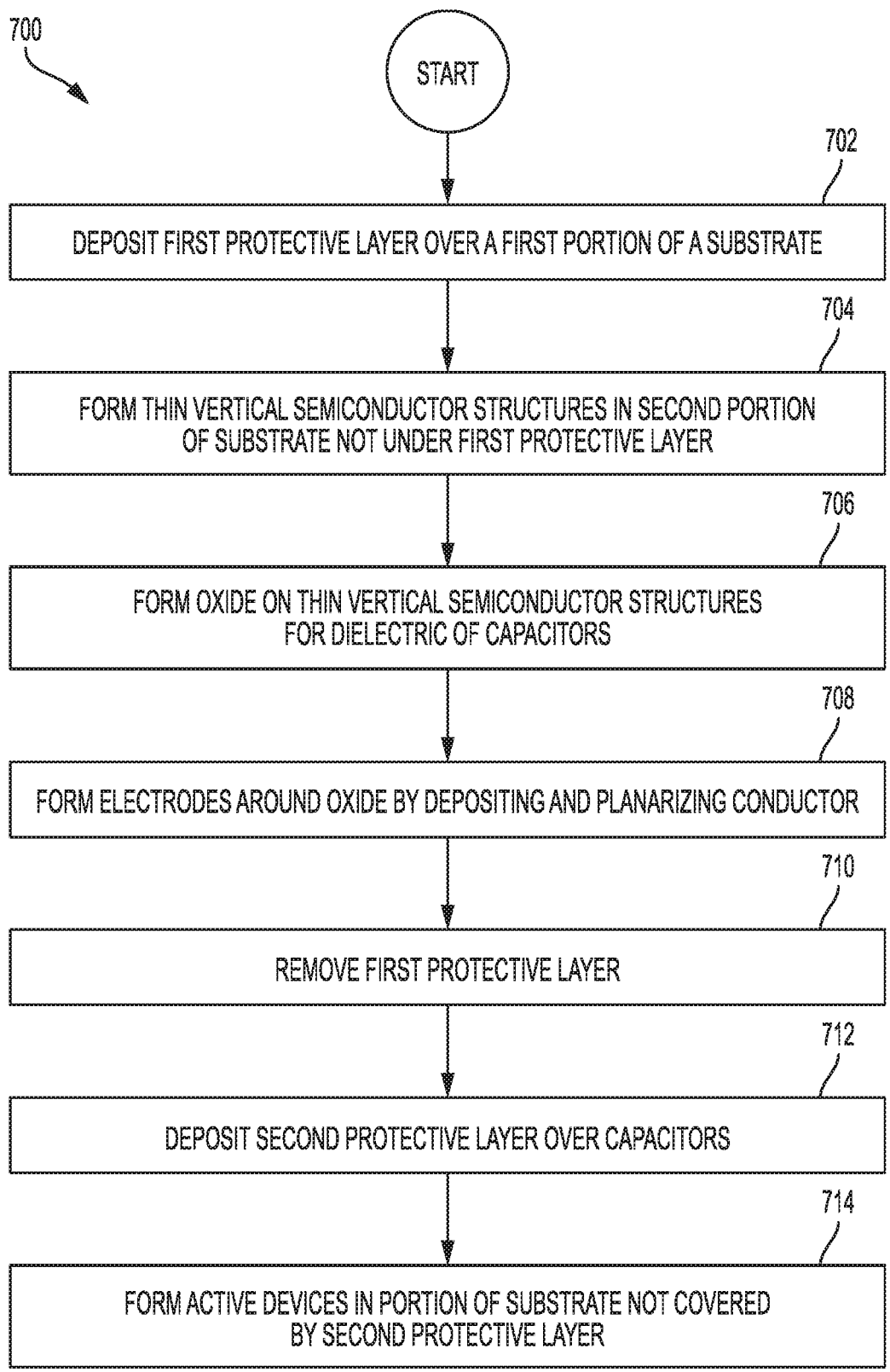
FIG. 7 is an example flow chart illustrating formation of high-density capacitors in one portion of a substrate for integration with other components on the substrate according to one embodiment of the disclosure.

The capacitors formed from thin vertical structures may be integrated with other components in an integrated circuit. One embodiment of a method for performing the integration is shown in the flow chart of FIG. 7 and cross-sectional views of FIGS. 8A-E. FIG. 7 is an example flow chart illustrating formation of high-density capacitors in one portion of a substrate for integration with other components on the substrate according to one embodiment of the disclosure; and FIGS. 8A-8E are example cross-sectional views of the formation of high-density capacitors based on thin silicon structures in one portion of a substrate according to embodiments of the disclosure.

A method 700 may begin at block 702 with depositing a first protective layer over a first portion of a substrate. A first protective layer 804 is illustrated after deposition and patterning on a substrate 802 in FIG. 8A. The first protective layer 804 may be used to protect a portion of the substrate 802 while thin vertical structures for capacitors are formed in other areas of the substrate 802. In one embodiment, the first protective layer 804, such as silicon nitride ($Si_3N_4$) and/or silicon dioxide ($SiO_2$), may be deposited and openings patterned in the first protective layer 804 over portions of the substrate where integrated circuit layouts have die areas assigned for high density capacitors.

Then, at block 704, the thin vertical structures are formed on the substrate in a second portion of the substrate not under the first protective layer. A plurality of thin vertical structures 806 is shown formed from substrate 802 in FIG. 8B. The vertical structures 806 may be formed by, for example, depositing a mask material (not shown), performing deep reactive etching (DRIE) to remove portions of the substrate 802 between the mask material, and then removing the mask material. The deep reactive ion etching (DRIE) may use chemistries selected to match the material of the substrate 802. For example, when the substrate 802 is silicon, a DRIE using xenon difluoride ($XeF_2$) may be selected to form a high aspect ratio vertical semiconductor structures. Other semiconductor manufacturing techniques, such as those used in FinFET manufacturing, may also be used in the manufacturing of thin vertical structures 806.

Next, at block 706, oxide may be formed on the thin vertical structures to form a dielectric layer of one or more capacitors. An oxide layer 802A is shown on substrate 802 and thin vertical structures 806 in FIG. 8C. The oxide may be formed, for example, when the substrate 802 is silicon, by heating the substrate 802 to high temperatures in an oxygen-rich atmosphere to form oxide at the exposed surfaces that diffuses through the substrate 802 at a rate controlled by temperature and atmospheric oxygen content.

Figure 8A:
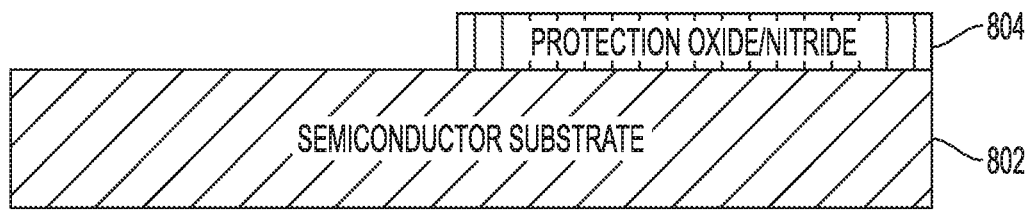
FIGS. 8A-8E are example cross-sectional views of the formation of high-density capacitors based on thin silicon structures in one portion of a substrate according to embodiments of the disclosure.
Figure 8B:
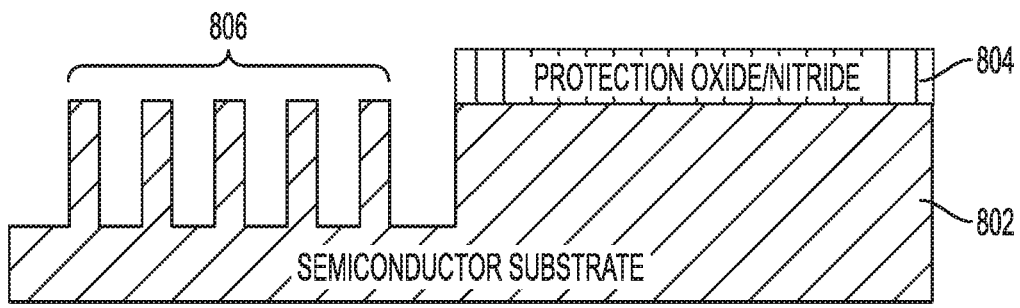
Figure 8C:
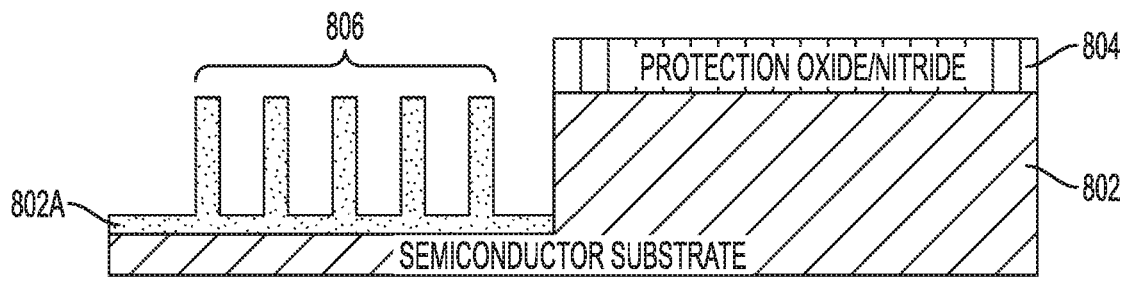
Figure 8D:
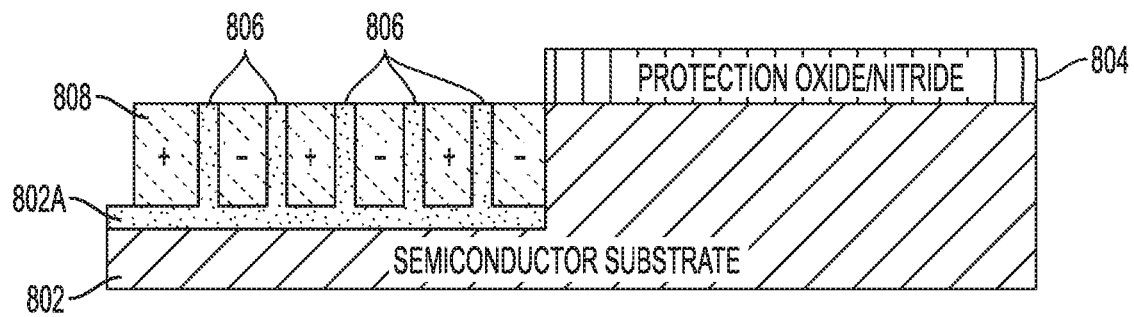
Figure 8E:
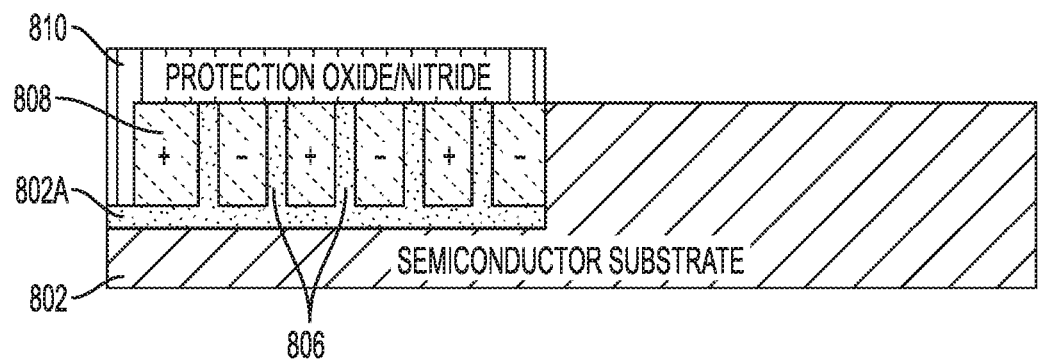

Then, at block 708, conductors may be formed around the oxide layer to form electrodes for the one or more capacitor. A conductor material 808 may be deposited to fill the openings etched into the substrate 802 as shown in FIG. 8D. A planarization step may then optionally be performed to create a smooth level surface at the transitions between the conductor material 808 and the thin vertical structures 806. Depending on the shape formed by thin vertical structures 806, two or more electrodes may be formed in the conductor material 808. The two electrodes may operate as positive and negative terminals to the capacitor formed by conductive material 808 and thin vertical structures 806.

Then, at block 710, the first protective layer 804 may be removed. After the formation of the capacitors from thin vertical structures 806 is complete, the protective layer 804 may no longer be needed. Thus, in some embodiments, the layer 804 may be removed to allow additional processing on the substrate 802 to be performed to manufacture other components of an integrated circuit (IC).

Next, at block 712, a second protective layer may be deposited over the capacitor(s) formed during blocks 704, 706, and 708. A protective layer 810 is shown over the conductive material 808 and thin vertical structures 806 in FIG. 8E. At block 714, additional processing, such as to form active devices, may be performed on the portion of the substrate 802 not covered by second protective layer 810.

Figure 9:
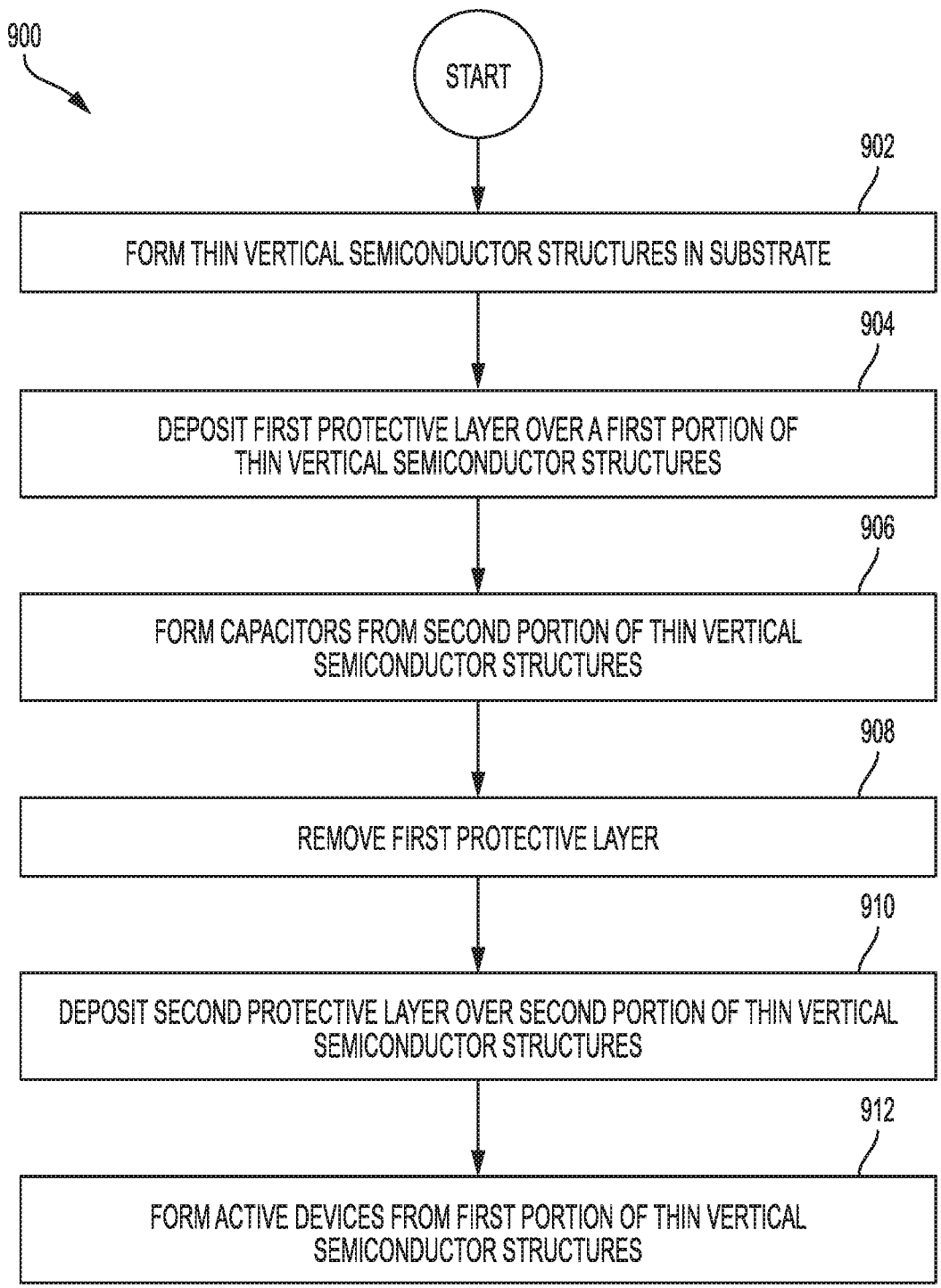
FIG. 9 is an example flow chart illustrating formation of high-density capacitors in one portion of a substrate for integration with other components on the substrate according to another embodiment of the disclosure.

Another embodiment of a method for performing the integration of capacitors formed from thin vertical structures with other components in an integrated circuit is shown in the flow chart of FIG. 9 and cross-sectional views of FIGS. 10A-D. FIG. 9 is an example flow chart illustrating formation of high-density capacitors in one portion of a substrate for integration with other components on the substrate according to another embodiment of the disclosure; and FIGS. 10A-D are example cross-sectional views of the formation of high-density capacitors based on thin silicon structures in one portion of a substrate according to embodiments of the disclosure.

A method 900 begins at block 902 with forming thin vertical structures on a substrate. Thin vertical structures 1004 are shown on a substrate 1002 in FIG. 10A. Although all of the substrate 1002 is shown patterned into thin vertical structures 1004, portions of the substrate 1002 may be left unpatterned. These unpatterned portions may be used in later processing for forming planar components, providing packaging connections, and/or providing die separation space to allow dicing the substrate into individual dies.

Figure 10A:
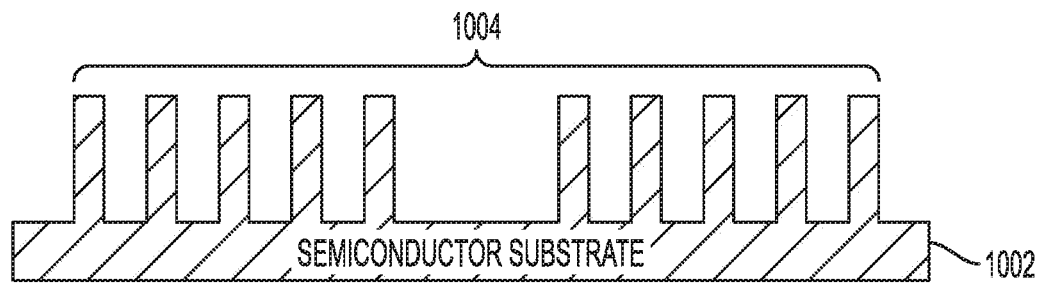
FIGS. 10A-D are example cross-sectional views of the formation of high-density capacitors based on thin silicon structures in one portion of a substrate according to embodiments of the disclosure.
Figure 10B:
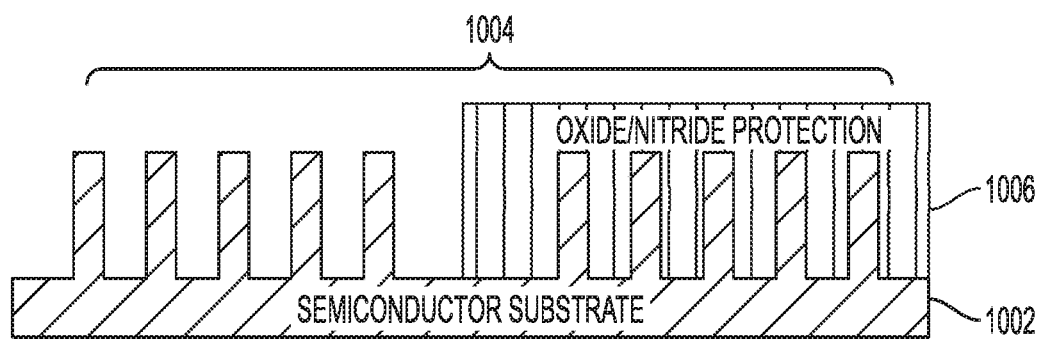

Then, at block 904, a first protective layer may be deposited over a first portion of the thin vertical structures. A first protective layer 1006, such as silicon nitride or silicon oxide, is shown in FIG. 10B. The first protective layer 1006 may protect a first portion of the structures 1004 while a second portion of the structures 1004 are manufactured into one or more capacitors. The protected structures 1004 may be processed at a later time into other components of the integrated circuit.

Figure 10C:
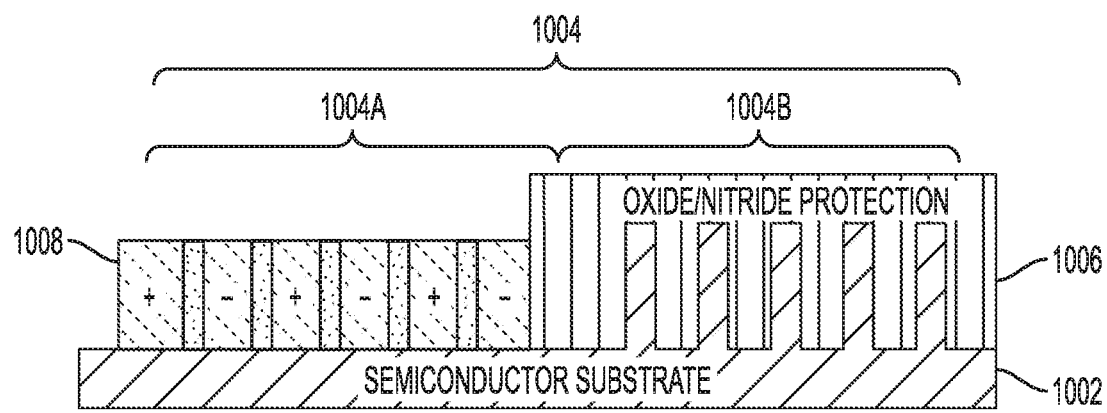

Next, at block 906, capacitors may be formed from the second portion of thin vertical structures. Capacitor 1008 manufactured from the second portion 1004A of thin vertical structures 1004 is shown in FIG. 10C. The manufacturing of capacitor 1008 may be performed, in one embodiment, through the manufacturing process of FIG. 5 to oxidize the portion 1004A and form conducting electrodes around the oxidized portion 1004A. Other manufacturing techniques and steps may be used in the manufacturing of capacitor 1008.

Then, at block 908, the first protective layer is removed. With the capacitor 1008 formed from the portion 1004A, the first protective layer 1006 may no longer be needed and thus be removed. Removal may be performed through a wet or dry etch that selectively removes the protective layer 1006.

Figure 10D:
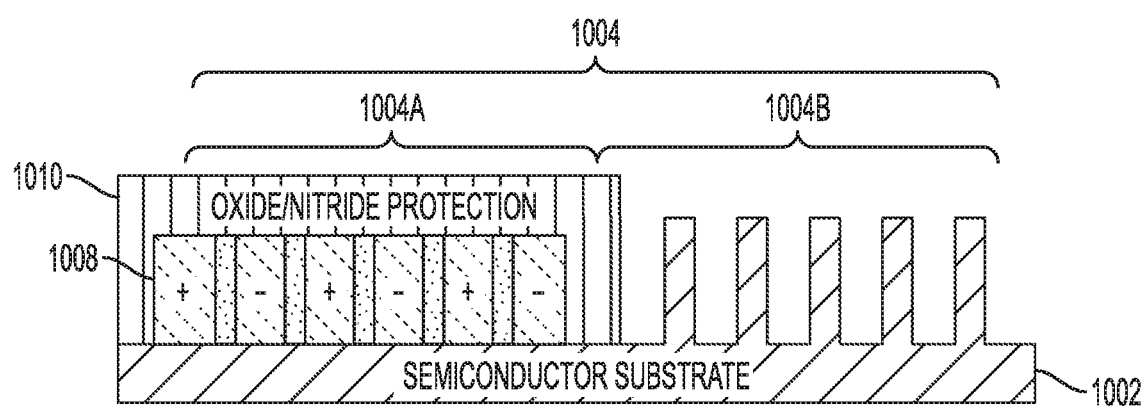

Next, at block 910, a second protective layer is deposited over the second portion of thin vertical structures to protect the capacitor during subsequent manufacturing processes. A protective layer 1010 around capacitor 1008 is shown in FIG. 10D. The first portion 1004B of thin vertical structures 1004 is shown outside of protective layer 1010, and subsequent processing may be performed at block 912 to form components from the portion 1004B. For example, transistors may be formed from the portion 1004B. The transistors may be coupled together to form logic circuitry, such as to process signals including audio signals. In some embodiments, the transistors may be organized as mixed-signal circuitry for processing both analog and digital signals. For example, the transistors may be connected to form electronic components, such as charge pump circuits or other power supply circuits, such that the capacitors based on the thin vertical structures may be coupled to or integrated with the electronic components as decoupling capacitors. In some embodiments, when the transistors are FinFET transistors, the protective layer 1010 may be removed before a source/drain implant step involved in forming the FinFET transistors.

The schematic flow chart diagrams of FIG. 5, FIG. 7, and FIG. 9 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A three-dimensional integrated circuit, comprising:
a plurality of capacitors, the plurality of capacitors comprising:
    a plurality of thin vertical oxide structures in a portion of a substrate having an oxide that encompasses substantially an entire thickness of the thin vertical oxide structure and wherein the oxide includes a horizontal portion ion the substrate that extends continuously between the plurality of thin vertical oxide structures; and
    electrodes coupled to the plurality of thin vertical oxide structures and configured to provide electrical contacts to the capacitors,
    wherein a smoothed conducting layer over the plurality of thin vertical oxide structure forms the electrodes, and
    wherein the plurality of vertical oxide structures and the horizontal portion form an insulator that electrically insulates the electrodes of the capacitors; and
a plurality of thin vertical semiconductor structures in an adjacent portion of the substrate, wherein the plurality of thin vertical semiconductor substrate is configured to be used as transistors, wherein the plurality of thin vertical semiconductor structures have substantially equal height and width as the plurality of thin vertical oxide structures.

2. The three-dimensional integrated circuit of claim 1, wherein the plurality of thin vertical oxide structures comprise a base with an oxidized surface on the base to be used as the dielectrics for the capacitors.

3. The three-dimensional integrated circuit of claim 1, wherein a ratio of a height of the plurality of thin vertical oxide structures to a pitch of the plurality of thin vertical oxide structures is greater than one, thereby providing that the capacitors are high density capacitors.

4. The three-dimensional integrated circuit of claim 1, further comprising electronic components manufactured on the substrate, wherein the electronic components are coupled to the capacitors.

5. The three-dimensional integrated circuit of claim 4, wherein the electronic components comprise active devices.

6. The three-dimensional integrated circuit of claim 5, wherein the active devices comprise FinFET transistors.

7. The three-dimensional integrated circuit of claim 5, wherein the active devices comprise planar transistors.

8. The three-dimensional integrated circuit of claim 1, wherein the electrodes extend approximately an entire length and height of the plurality of thin vertical oxide structures.

9. The three-dimensional integrated circuit of claim 1, wherein the plurality of thin vertical oxide structures comprise FinFET structures.

10. The three-dimensional integrated circuit of claim 1, wherein the plurality of thin vertical oxide structures are formed by oxidizing thin vertical semiconductor structures.

11. The three-dimensional integrated circuit of claim 1, wherein the electrodes comprise at least a first electrode and a second electrode on opposing sides of the plurality of thin vertical oxide structures to form a metal-insulator-metal structure for at least one of the capacitors.

12. The three-dimensional integrated circuit of claim 1, wherein a pitch between thin vertical oxide structures of the plurality of thin vertical oxide structures is between 20 and 80 nanometers.

13. The three-dimensional integrated circuit of claim 1, wherein a width of the plurality of thin vertical oxide structures is approximately equal to a width of the plurality of thin semiconductor structures.

14. The three-dimensional integrated circuit of claim 1, wherein each of the thin vertical oxide structures of the plurality of thin vertical oxide structures comprise a width of 2-12 nanometers and a height of 40 to 160 nanometers.

15. The three-dimensional integrated circuit of claim 1, wherein each of the thin vertical semiconductor oxide structures of the plurality of oxide thin vertical semiconductor oxide structures comprise a width of 2-12 nanometers and a height of 10 to 160 nanometers, wherein the second plurality is configured to be used as FinFET transistors, and wherein each of the thin vertical semiconductor structures of the second plurality of thin vertical semiconductor structures comprise a width of 2-12 nanometers and a height of 40 to 160 nanometers.

* * * * *

UNITED STATES PATENT AND TRADEMARK OFFICE
CERTIFICATE OF CORRECTION

Page 1 of 2

PATENT NO. : 10,867,994 B2
APPLICATION NO. : 15/910843
DATED : December 15, 2020
INVENTOR(S) : Shi et al.

It is certified that error appears in the above-identified patent and that said Letters Patent is hereby corrected as shown below:

In the Specification

In Column 1, Line 9, delete "2016," and insert -- 2016, now Pat. No. 9,929,147, --, therefor.

In Column 6, Line 4, delete "thin vertical structures 206A." and insert -- thin vertical structures 202. --, therefor.

In Column 6, Line 9, delete "thin vertical structures 206A," and insert -- thin vertical structures 202, --, therefor.

In Column 6, Line 12, delete "thin vertical structures 206." and insert -- thin vertical structures 202. --, therefor.

In Column 6, Line 45, delete "Chemical Planarization or Polishing (CMP)" and insert -- Chemical Mechanical Planarization or Polishing (CMP) --, therefor.

In Column 8, Line 17, delete "deep reactive etching (DRIE)" and insert -- deep reactive ion etching (DRIE) --, therefor.

In the Claims

In Column 10, Line 39, in Claim 1, delete "structure" and insert -- structures --, therefor.

In Column 10, Line 40, in Claim 1, delete "ion" and insert -- in --, therefor.

In Column 10, Line 47, in Claim 1, delete "structure" and insert -- structures --, therefor.

In Column 10, Line 54, in Claim 1, delete "substrate" and insert -- structures --, therefor.

In Column 12, Line 14, in Claim 15, delete "vertical semiconductor" and insert -- vertical --, therefor.

Signed and Sealed this
Nineteenth Day of July, 2022

Katherine Kelly Vidal
*Director of the United States Patent and Trademark Office*

CERTIFICATE OF CORRECTION (continued)
U.S. Pat. No. 10,867,994 B2

In Column 12, Line 15, in Claim 15, delete "oxide thin vertical semiconductor" and insert -- thin vertical --, therefor.

In Column 12, Line 17, in Claim 15, delete "10" and insert -- 40 --, therefor.